(12) United States Patent
Gupta et al.

(10) Patent No.: US 6,348,407 B1
(45) Date of Patent: Feb. 19, 2002

(54) METHOD TO IMPROVE ADHESION OF ORGANIC DIELECTRICS IN DUAL DAMASCENE INTERCONNECTS

(75) Inventors: Subhash Gupta, Singapore (SG); Yi Xu, Burnaby (CA); Simon Chooi; Mei Sheng Zhou, both of Singapore (SG)

(73) Assignee: Chartered Semiconductor Manufacturing Inc., Milpitas, CA (US)

( * ) Notice: Subject to any disclaimer, the term of this patent is extended or adjusted under 35 U.S.C. 154(b) by 0 days.

(21) Appl. No.: 09/805,955

(22) Filed: Mar. 15, 2001

(51) Int. Cl.$^7$ .................... H01L 21/4763; H01L 21/31; H01L 21/469
(52) U.S. Cl. .............. 438/637; 438/622; 438/623; 438/624; 438/626; 438/628; 438/638; 438/780; 438/787
(58) Field of Search .................. 438/638, 623, 438/624, 622, 637, 634, 639, 640, 743, 778, 780, 781, 787, 788, 789, 790, 625, 626, 627, 628, 629, 633

(56) References Cited

U.S. PATENT DOCUMENTS

| | | | |
|---|---|---|---|
| 5,733,706 A | * 3/1998 | Sezi et al. ............... | 430/270.1 |
| 5,830,801 A | 11/1998 | Shiralagi et al. ............ | 438/586 |
| 6,040,243 A | 3/2000 | Li et al. ..................... | 438/687 |
| 6,054,379 A | 4/2000 | Yau et al. ................... | 438/623 |
| 6,218,302 B1 | * 4/2001 | Braeclemann et al. ...... | 438/687 |
| 6,232,235 B1 | * 5/2001 | Cave et al. ................. | 438/715 |
| 6,251,804 B1 | * 6/2001 | Chen et al. ................. | 438/778 |
| 6,271,593 B1 | * 8/2001 | Givens et al. .............. | 257/752 |

* cited by examiner

*Primary Examiner*—Charles Bowers
*Assistant Examiner*—Thanhha Pham
(74) *Attorney, Agent, or Firm*—George O. Saile; Rosemary L. S. Pike

(57) ABSTRACT

This invention relates to a method of fabrication used for semiconductor integrated circuit devices, and more specifically to the use an alternate etch stop in dual damascene interconnects that improves adhesion between low dielectric constant organic materials. In addition, the etch stop material is a silicon containing material and is transformed into a low dielectric constant material (k=3.5 to 5), which becomes silicon-rich silicon oxide after UV radiation and silylation, oxygen plasma.

34 Claims, 2 Drawing Sheets

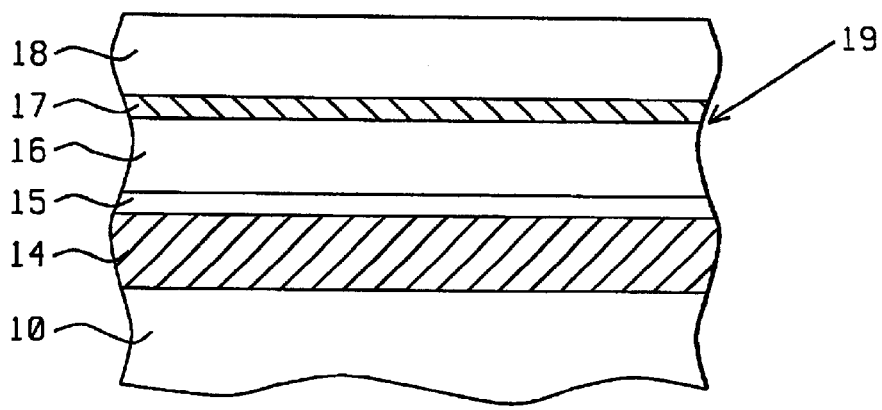
FIG. 1 – Prior Art
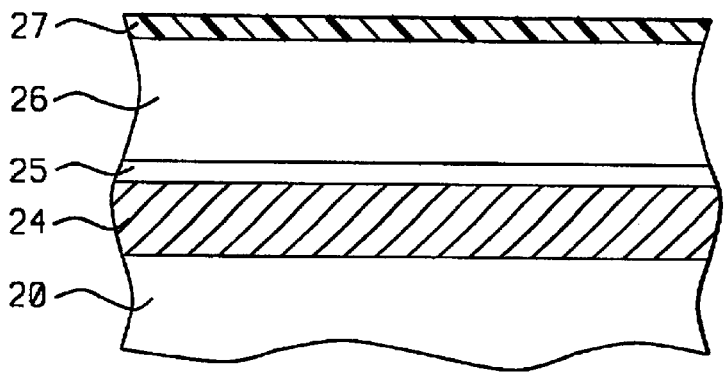
FIG. 2
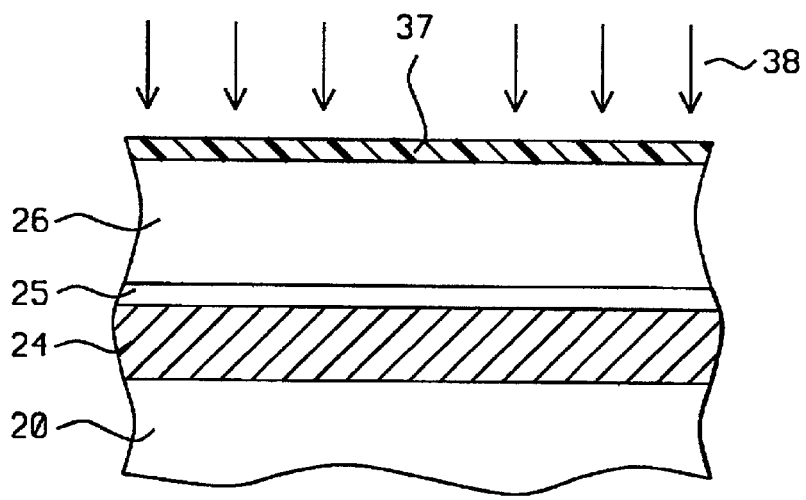
FIG. 3

METHOD TO IMPROVE ADHESION OF ORGANIC DIELECTRICS IN DUAL DAMASCENE INTERCONNECTS

BACKGROUND OF THE INVENTION (1) Field of the Invention

This invention relates to a method of fabrication used for semiconductor integrated circuit devices, and more specifically to the use an alternate etch stop in dual damascene interconnects that improves adhesion between low dielectric constant organic materials, with the etch stop being a low dielectric constant material, consisting of a silicon containing material, which becomes silicon-rich silicon oxide after UV radiation and oxygen plasma.

(2) Description of Related Art

Related Prior Art background patents will now be described in this section.

U.S. Pat. No. 5,830,801 entitled "Resistless Methods of Gate Formation in MOS Devices" granted Nov. 3, 1998 to Shiralagi et al. describes a UV method to form a silicon-rich oxide layer. The method is directed toward forming an MOS gate and defining the gate area, which includes forming an oxide mask by positioning a light mask adjacent a surface of a polysilicon layer and exposing the surface through the light mask to a deep ultra violet light in an ambient containing oxygen.

U.S. Pat. No. 6,040,243 entitled "Method to Form Copper Damascene Interconnects Using a Reverse Barrier Metal Scheme to Eliminate Copper Diffusion" granted Mar. 21, 2000 to Li et al. describes dual damascene process comprising: form bottom low K material, form etch stop layer, form top low K and then etch dual damascene opening. Diffusion of copper into dielectric layers due to overetch of the passivation layer is eliminated by a barrier layer. The method can be used to form dual damascene interconnects. Copper traces through an isolation layer are provided overlying a semiconductor substrate. A passivation layer is deposited overlying the copper traces and the isolation layer. A dielectric layer is deposited. A cap layer is deposited. The cap layer and the dielectric layer are patterned to expose the top surface of the passivation layer and to form trenches for the damascene visa. A barrier layer is deposited overlying the passivation layer, the dielectric layer, and the cap layer. The barrier layer is etched though to expose the top surfaces of the cap layer and the passivation layer. The barrier layer isolates the sidewalls of the trenches. The passivation layer is etched through to complete damascene vias. The barrier layer prevents copper sputtering onto the dielectric layer during the step of etching through the passivation layer.

U.S. Pat. No. 6,054,379 entitled "Method of Depositing a Low K Dielectric with Organo Silane" granted Apr. 25, 2000 to Yau et al. teaches a dual damascene process by oxidizing an organo silicon film. A method and apparatus for depositing a low dielectric constant film is described using a reaction of an organo silane compound and an oxidizing gas. The oxidized organo silane film has barrier properties for use as a liner or cap layer adjacent to other dielectric layers. The oxidized organo silane film can also be used as an etch stop or an intermetal dielectric layer for fabricating dual damascene structures. The oxidized organo silane films also provide excellent adhesion between different dielectric layers.

SUMMARY OF THE INVENTION

This invention relates to a method of fabrication used for semiconductor integrated circuit devices, and more specifically to the use an alternate etch stop in dual damascene interconnects that improves adhesion between low dielectric constant organic materials. In addition, the etch stop material, which is a silicon containing material, is transformed into a silicon-rich silicon oxide after UV radiation and silylation, oxygen plasma.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include:

FIG. 1, which is cross-sectional representation illustrates the Prior Art method showing an adhesion problem at the interface between organic or carbon-doped $SiO_2$ material and TEOS-base $SiO_2$ etch stop material.

FIG. 2, which is cross-sectional representation illustrates the silicon containing adhesion layer on the low dielectric constant material.

FIG. 3, which is cross-sectional representation illustrates the silicon containing adhesion layer being exposed to UV radiation forming a silicon rich top layer.

DESCRIPTION OF THE PREFERRED EMBODIMENTS

Figure 4:
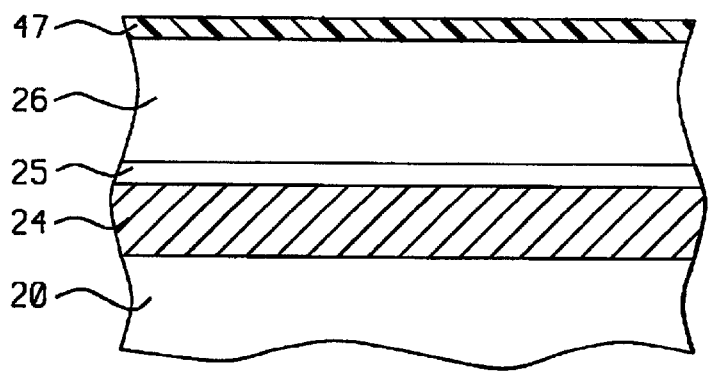
FIG. 4, which is cross-sectional representation illustrates the silicon-rich adhesion layer being transformed to Si-rich SiO through silylation, oxygen plasma and having a low dielectric constant between 3.5 to 5.

This invention relates to a method of fabrication used for semiconductor integrated circuit devices, and more specifically to the use an alternate etch stop in dual damascene interconnects that improves adhesion between low dielectric constant materials, which are organic-based or carbon-doped $SiO_2$. In addition, the etch stop material is a silicon containing material and is transformed into a low dielectric constant material (k=3.5 to 5), which becomes silicon-rich silicon oxide after UV radiation and silylation, oxygen plasma.

Referring to FIG. 1, which in cross-sectional representation illustrates the Prior Art method showing an adhesion problem at the interface (19) between organic or carbon-doped $SiO_2$ material (16) and the TEOS-based $SiO_2$ etch stop material (17) (TEOS=tetraethylorthosilicate). As a background to this problem, the integration of organic-based or carbon-doped $SiO_2$, low dielectric constant material, in dual damascene processing presents a challenge (regardless of via-first, trench-first or self-aligned via approach). In particular, there exists an adhesion problem at the interface (19) between the low dielectric material (16) and the TEOS-based $SiO_2$ etch stop (17), as illustrated in FIG. 1, for Prior Art methods. One solution to the adhesion problem is to use SiN as an etch stop. However, the dielectric constant of SiN is too high, about k=7, in comparison to k=3.9 for $SiO_2$.

High dielectric constant materials lead to high RC time constant delays in interconnect wiring. For completeness, the other material layers provided in FIG. 1, Prior Art, are as follows: semiconductor single crystal silicon substrate 10, patterned conducting metal wiring 14 (embedded in an insulator, which is not shown in cross-sectional Figs.), first low dielectric constant material 14, which is organic-based or carbon-doped $SiO_2$, TEOS-base $SiO_2$ etch stop material (17) (tetraethylorthosilicate), second low dielectric constant material 18, which is organic-based or carbon-doped $SiO_2$, and finally, the adhesion problem at the interface (19) between the dielectric material (16) and the TEOS-based $SiO_2$ etch stop (17). It is the object of the present invention, to solve the adhesion problem at the interface between the low dielectric material, which is organic-based or carbon-doped $SiO_2$, and the TEOS-based $SiO_2$ etch stop, (tetraethylorthosilicate).

Referring to FIG. 2, which in cross-sectional representation illustrates silicon containing adhesion layer (27), e.g., TSI resist, on low dielectric constant material (26) which is organic-based or carbon-doped $SiO_2$. It is this specially treated adhesion layer that is key to the present invention. For completeness, some of the other material layers provided in FIG. 2, are as follows: semiconductor substrate 20 which includes but is not restricted to monocrystalline silicon, silicon-on-insulator (SOI) and silicon-germanium (SiGe), and patterned conducting metal wiring 24 (embedded in an insulator, which is not shown in cross-sectional Figs.). The semiconductor substrate 20 should be understood to possibly include one or more layers of insulating material and/or conductive material and one or more active and/or passive devices, formed in or over the substrate, or the like, and one or more interconnect structures, such as, vias, contacts, trenches, metal wirings and the like. A passivation layer 25, which is an insulator, preferably silicon nitride, is deposited over the patterned conducting wiring 24, which is embedded in an insulator (not shown in cross-sectional Figs.). Next, a first low dielectric constant material layer 26, which is organic-based or carbon-doped $SiO_2$, is deposited over the passivation layer 25. Key to the present invention, is the next process step, the coating of the surface with a silicon containing adhesion layer (27), (which is derived from the processing of TSI resist), coating directly on the low dielectric constant material (26), which is organic-based or carbon-doped $SiO_2$. Note, this silicon containing adhesion layer (27), e.g., TSI resist, is an alternate etch stop material is dual damascene, and as described in subsequent processing steps, becomes transformed into silicon-rich silicon oxide, through silylation, after UV radiation and silyation, oxygen plasma.

An interlevel dielectric (ILD) comprised of silicon oxide can also be used in combination with low dielectric constant material layers. The silicon oxide is deposited by chemical vapor deposition (CVD) using tetraethoxysilane (TEOS) in a thickness range from 1,000 to 10,000 Angstroms. The processing details for the low dielectric insulating layers are as follows: layer thickness ranges between 1,000 to 10,000 Angstroms for the dual damascene trench/via build. However, the key embodiments of the present invention also apply to single damascene interconnects. The low k material is formed by either chemical vapor deposition (CVD) or by spin coating. The spin coating method requires a post-coating oven bake and an optional furnace curing step. The low k materials are organic based materials are selected from the group consisting of organic polymers comprised of 100% carbon, carbon with one or more of the following elements: hydrogen, fluorine, sulfur, nitrogen and bromine. Organic based materials are selected from the group consisting of buckminsterfullerene, SiLK (from Dow Chemical) and FLARE (from Honeywell). Carbon doped $SiO_2$ materials are selected from the group consisting of alkyl silsesquioxane, aryl silsesquioxane, CORAL (from Novellus), Black Diamond (from Applied Materials). Both the organic based materials and the carbon doped $SiO_2$ are available in both a non-porous or a porous form.

Referring to FIG. 3, which in cross-sectional representation illustrates another key process of the present invention, the silicon containing adhesion layer (37) undergoing exposure to UV radiation (38) forming an exposed layer, which is comprised of a silicon-rich material. The UV wavelength ranges from 436 to 100 nm, with an exposure time between 1 sec to 5 min. In another preferred embodiment, a pre-silylation bake at between 50 to 400° C. can be performed to promote cross-linking of the exposed layer.

Referring to FIG. 4, which in cross-sectional representation illustrates the final key process of the present invention, the silicon-rich adhesion layer (47), undergoes a transformation to Si-rich SiO through a silylation and an oxygen plasma process, and consequently measures as a low dielectric constant material, with k value between 3.5 to 5. The silylation conditions are as follows: an inert gas, e.g., nitrogen, is bubbled in liquid HMDS (hexamethyldisilazane), transporting HMDS in the vapor phase. The HMDS vapor is then introduced to TSI resist in a reaction chamber, wherein the silicon substrate wafer is heated to between 40 to 150° C. Alternately, solutions of 10% HMDS (hexamethyldisilazane) in xylene can also cause the resist to become silylated. The oxygen plasma process or treatment conditions are as follows: treatment performed at temperatures between 40 to 400° C., at pressures between 1 milliTorr to 50 Torr using oxygen gas. Oxygen flow rates are from 100 sccm to 50,000 sccm. Power settings of between 100 to 2,000 Watts can be used if RF or microwave is capacitatively coupled to the plasma. Forming gas (96% nitrogen, 4% hydrogen) can be optionally added to the oxygen gas, to aid in the dissociation of oxygen.

Figure 5:
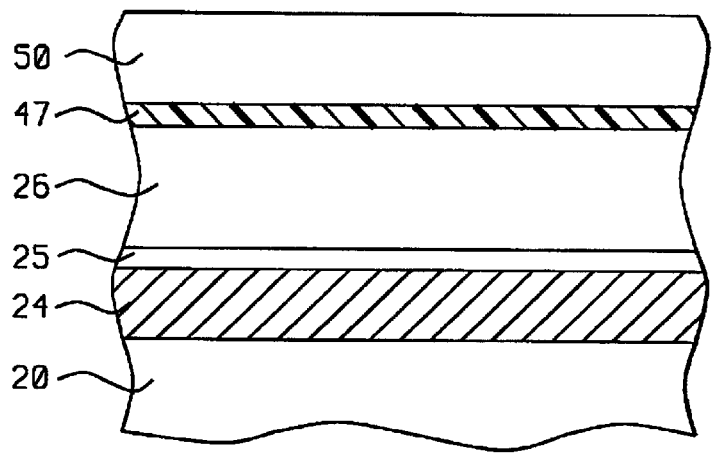
FIG. 5, which is cross-sectional representation illustrates the deposition of a second low dielectric material layer on Si-rich SiO adhesion layer.

Referring to FIG. 5, which in cross-sectional representation illustrates the next process step, in a dual damascene build, the deposition of a second low dielectric material layer (50) on the specially treated Si-rich SiO adhesion layer (47). Form this point on, the dual damascene build and processing is "conventional".

Figure 6:
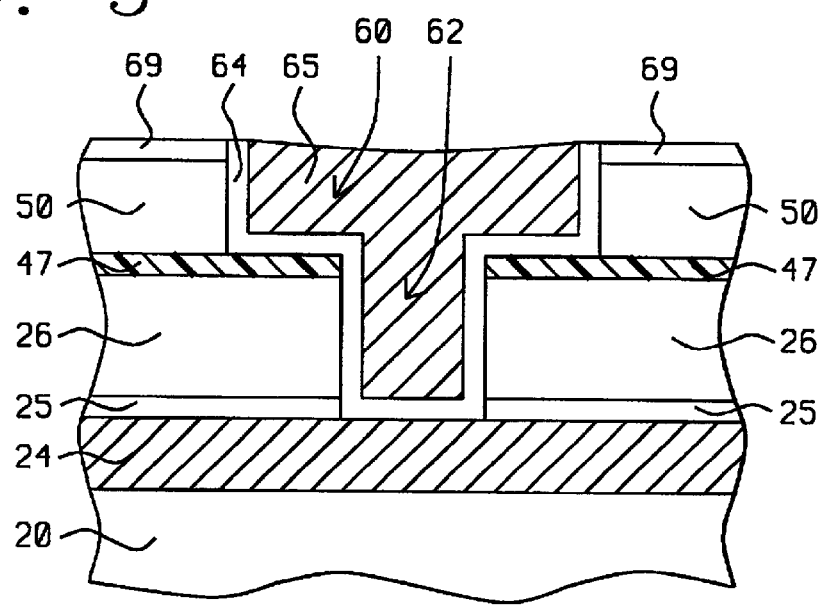
FIG. 6, which is cross-sectional representation illustrates the formation of dual damascene trench/via opening with copper plating and subsequent planarization of the surface.

Referring to FIG. 6, which is cross-sectional representation illustrates the formation of dual damascene trench/via opening with copper plating and subsequent planarization of the surface. Note: the special treated Si-rich SiO adhesion layer (47), undergoes patterning and etching, to form trench (60 arrow) and via (62 arrow) opening, as do the low dielectric constant material layers 26 and 50. The special treated Si-rich SiO adhesion layer (47) can also be used to act as an etch stop, in dual damascene trench formation. A barrier metal layer (64) is deposited into the trench/via opening or cavity and acts a trench/via liner. The barrier metal layer thickness is between approximately 50 to 2,000 Angstroms. The barrier metal is selected from the group consisting of tantalum, tantalum nitride, titanium nitride and ternary metal silicon nitride.

Referring again to FIG. 6, in cross-sectional representation, illustrates the filling of trench/via opening or cavity with conducting metal (65), in a dual damascene process. The two layers of low dielectric constant insulators 26 and 50 are patterned and reactive ion etched (RIE) forming trench 60 (arrow) and via 62 (arrow) openings.

Many photo lithographic processes can be employed to pattern the trench/via opening. As stated above, after trench/via opening or cavity definition, the trench/via is filled with a blanket deposition of a barrier layer (64). The barrier layer is approximately 50 to 2,000 Angstroms thick. Electroplating requires the deposition of a copper seed layer (not shown) over the barrier layer. The seed layer thickness comprises thickness ranges from 50 to 2,000 Angstroms and is deposited by chemical vapor deposition (CVD) or by sputtering, physical vapor deposition (PVD). The barrier layer material (64), completely lines the trench/via opening or cavity, and are on the two layers of low dielectric constant insulator, 26 and 50, respectively. Next, thick conducting copper 65 is deposited, by either electroplating (preferred method) or by electroless plating, upon the copper seed layer. Copper electroplating is the preferred method for obtaining the thick copper. The thick copper layer 65 dips into the trench/via opening or cavity. The plated thick copper deposition is approximately from 1 to 10 microns in thickness. The plated thick copper undergoes an annealing step using rapid thermal annealing (RTA) from between 50 to 450° C.

Referring yet again to FIG. 6, in cross-sectional representation, illustrates the planarization of the excess material in the trench/via opening or cavity to form conducting interconnect wiring (60) and conducting contact via (62), with inlaid copper (65) in a dual damascene process. The excess material in the thick copper layer is polished back and planarized, along with the barrier metal layer, by chemical mechanical polish (CMP). Note, key to the present invention is the special treated Si-rich SiO adhesion layer (47), shown in place. Finally, as an optional process layer in the present invention, is the deposition and patterning of a top protective cap layer (69). The cap layer is selected from the group consisting of silicon nitride, silicon oxynitride and silicon carbide. The cap layer is deposited by chemical vapor deposition (CVD) in a thickness range from 50 to 5,000 Angstroms.

While the invention has been particularly shown and described with reference to the preferred embodiments thereof, it will be understood by those skilled in the art that various changes in form and details may be made without departing from the spirit and scope of the invention.

What is claimed is:

1. A method of fabricating damascene comprising:

providing a semiconductor substrate;

providing patterned metal wiring embedded in an insulator over the semiconductor substrate;

depositing a passivation layer over said patterned metal wiring;

depositing a first low dielectric constant material layer upon said passivation layer;

coating a silicon containing adhesion layer on the first low dielectric constant material layer;

exposing said silicon containing adhesion layer to UV radiation;

exposing said silicon containing adhesion layer to a silylation and oxygen plasma process;

depositing a second low dielectric constant material layer upon said silicon containing adhesion layer;

providing patterning and etching the second and first low dielectric constant material layers, the silicon containing adhesion layer, and the passivation layer to form trench/via openings extending to the patterned metal wiring;

depositing a blanket layer of barrier metal over the semiconductor substrate and into the trench/via opening;

depositing a blanket conducting copper seed layer over the barrier metal;

depositing by electroplating or electroless plating conducting thick copper upon the copper seed layer.

2. The method of claim 1, wherein said semiconductor substrate is selected from the group consisting of single crystal silicon, silicon-on-insulator (SOI), silicon-germanium (SiGe) with semiconductor devices, interconnect wiring and contact vias over the substrate.

3. The method of claim 1, wherein said layer of first low dielectric constant material layer selected from the group consisting of either organic based materials or carbon doped $SiO_2$ materials, wherein organic based materials are selected from the group consisting of organic polymers comprised of 100% carbon, carbon with one or more of the following elements: hydrogen, fluorine, sulfur, nitrogen, bromine, while carbon doped $SiO_2$ materials are selected from the group consisting of alkyl silsesquioxane, aryl silsesquioxane, CORAL (from Novellus), Black Diamond (from Applied Materials).

4. The method of claim 1, wherein said layer of second low dielectric constant material layer selected from the group consisting of either organic based materials or carbon doped $SiO_2$ materials, wherein organic based materials are selected from the group consisting of organic polymers comprised of 100% carbon, carbon with one or more of the following elements: hydrogen, fluorine, sulfur, nitrogen, bromine, while carbon doped $SiO_2$ materials are selected from the group consisting of alkyl silsesquioxane, aryl silsesquioxane, CORAL (from Novellus), Black Diamond (from Applied Materials).

5. The method of claim 1, wherein said silicon containing adhesion layer is comprised of a silicon containing material selected from the group consisting of TSI resist that is transformed into silicon-rich silicon oxide by subsequent processing steps including silylation, exposure to UV radiation, oxygen plasma treatment and has a low dielectric constant between 3.5 to 5.

6. The method of claim 1, wherein said silicon containing adhesion layer is exposed forming an exposed layer, which is comprised of a silicon-rich material, whereby the UV wavelength ranges from 436 to 100 nm, with an exposure time between 1 sec to 5 min, and furthermore, a pre-silylation bake at between 50 to 400° C. promotes cross-linking of the exposed layer.

7. The method of claim 1, wherein said silicon containing adhesion layer is comprised of TSI resist and is exposed to said silylation, wherein the silylation conditions are as follows: an inert gas, nitrogen, is bubbled in liquid HMDS (hexamethyldisilazane), thus, transporting HMDS in the vapor phase to TSI resist in a reaction chamber, wherein the semiconductor substrate wafer is heated to between 40 to 150° C., or alternately, using solutions of 10% HMDS (hexamethyldisilazane) in xylene causes the resist to become silylated.

8. The method of claim 1, wherein said silicon containing adhesion layer is comprised of TSI resist and is exposed to said oxygen plasma process under conditions as follows: the oxygen plasmas process is performed at temperatures between 40 to 400° C., at pressures between 1 milliTorr to 50 Torr using oxygen gas, oxygen flow rates are from 100 sccm to 50,000 sccm, power settings of between 100 to 2,000 Watts with RF or microwave capacitatively coupled to the plasma, with the addition of forming gas (96% nitrogen, 4% hydrogen) added to the oxygen gas, to aid in the dissociation of oxygen.

9. The method of claim 1, wherein said barrier metal is selected from the group consisting of tantalum, tantalum nitride, titanium nitride, ternary metal silicon nitride; and the barrier metal has a thickness between approximately 50 to 2,000 Angstroms.

10. The method of claim 1, wherein said copper seed layer is deposited over the barrier metal by chemical vapor deposition (CVD) or by sputtering, physical vapor deposition (PVD), in a thickness range from 50 to 2,000 Angstroms.

11. The method of claim 1, wherein said conducting thick copper is in a thickness range from 1 to 10 microns.

12. A method of fabricating damascene trench/via using a silicon containing adhesion layer comprising:

providing a semiconductor substrate;

providing patterned metal wiring embedded in an insulator over the semiconductor substrate;

depositing a passivation layer over said patterned metal wiring;

depositing a first low dielectric constant material layer upon said passivation layer;

coating a silicon containing adhesion layer on the first low dielectric constant material layer;

exposing said silicon containing adhesion layer to UV radiation;

exposing said silicon containing adhesion layer to a silylation and oxygen plasma process;

depositing a second low dielectric constant material layer upon said silicon containing adhesion layer;

providing patterning and etching of the second and first low dielectric constant material layers, the adhesion layer, and the passivation layer to form trench/via opening extending to the patterned metal wiring;

depositing a blanket layer of barrier metal over the semiconductor substrate and into the trench/via opening;

depositing a blanket conducting copper seed layer over the barrier metal;

depositing by electroplating or electroless plating conducting thick copper upon the copper seed layer;

chemical-mechanical polishing and planarizing to remove excess thick copper, excess copper seed layer and excess barrier metal thereby forming an inlaid interconnect and contact via to said patterned metal wiring with said barrier metal lining the trench/via opening.

13. The method of claim 12, wherein said semiconductor substrate is selected from the group consisting of single crystal silicon, silicon-on-insulator (SOI), silicon-germanium (SiGe) with semiconductor devices, interconnect wiring and contact vias over the substrate.

14. The method of claim 12, wherein said layer of first low dielectric constant material layer selected from the group consisting of either organic based materials or carbon doped $SiO_2$ materials, wherein organic based materials are selected from the group consisting of organic polymers comprised of 100% carbon, carbon with one or more of the following elements: hydrogen, fluorine, sulfur, nitrogen, bromine, while carbon doped $SiO_2$ materials are selected from the group consisting of alkyl silsesquioxane, aryl silsesquioxane, CORAL (from Novellus), Black Diamond (from Applied Materials).

15. The method of claim 12, wherein said layer of second low dielectric constant material layer selected from the group consisting of either organic based materials or carbon doped $SiO_2$ materials, wherein organic based materials are selected from the group consisting of organic polymers comprised of 100% carbon, carbon with one or more of the following elements: hydrogen, fluorine, sulfur, nitrogen, bromine, while carbon doped $SiO_2$ materials are selected from the group consisting of alkyl silsesquioxane, aryl silsesquioxane, CORAL (from Novellus), Black Diamond (from Applied Materials).

16. The method of claim 12, wherein said silicon containing adhesion layer is comprised of a silicon containing material selected from the group consisting of TSI resist that is transformed into silicon-rich silicon oxide by subsequent processing steps including silylation, exposure to UV radiation, oxygen plasma treatment and has a low dielectric constant between 3.5 to 5.

17. The method of claim 12, wherein said silicon containing adhesion layer is exposed forming an exposed layer, which is comprised of a silicon-rich material, whereby the UV wavelength ranges from 436 to 100 nm, with an exposure time between 1 sec to 5 min, and furthermore, a pre-silylation bake at between 50 to 400° C. promotes cross-linking of the exposed layer.

18. The method of claim 12, wherein said silicon containing adhesion layer is comprised of TSI resist and is exposed to said silylation, wherein the silylation conditions are as follows: an inert gas, nitrogen, is bubbled in liquid HMDS (hexamethyldisilazane), thus, transporting HMDS in the vapor phase to TSI resist in a reaction chamber, wherein the semiconductor substrate wafer is heated to between 40 to 150° C., or alternately, using solutions of 10% HMDS (hexamethyldisilazane) in xylene causes the resist to become silylated.

19. The method of claim 12, wherein said silicon containing adhesion layer is comprised of TSI resist and is exposed to said oxygen plasma process under conditions as follows: the oxygen plasmas process is performed at temperatures between 40 to 400° C., at pressures between 1 milliTorr to 50 Torr using oxygen gas, oxygen flow rates are from 100 sccm to 50,000 sccm, power settings of between 100 to 2,000 Watts with RF or microwave capacitatively coupled to the plasma, with the addition of forming gas (96% nitrogen, 4% hydrogen) added to the oxygen gas, to aid in the dissociation of oxygen.

20. The method of claim 12, wherein said barrier metal is selected from the group consisting of tantalum, tantalum nitride, titanium nitride, ternary metal silicon nitride; and the barrier metal has a thickness between approximately 50 to 2,000 Angstroms.

21. The method of claim 12, wherein said copper seed layer is deposited over the barrier metal by chemical vapor deposition (CVD) or by sputtering, physical vapor deposition (PVD), in a thickness range from 50 to 2,000 Angstroms.

22. The method of claim 12, wherein said conducting thick copper is in a thickness range from 1 to 10 microns.

23. A method of fabricating damascene trench/via using a silicon containing low dielectric constant adhesion layer, which is an alternate etch stop in dual damascene, in the fabrication of semiconductor devices, comprising:

providing a semiconductor substrate with semiconductor devices within the semiconductor substrate;

providing patterned metal wiring embedded in an insulator over the semiconductor substrate;

depositing a passivation layer over said patterned metal wiring;

depositing a first low dielectric constant material layer, which is organic-based or carbon doped $SiO_2$, upon said passivation layer;

coating a silicon containing adhesion layer on the first low dielectric constant material layer;

exposing said silicon containing adhesion layer to UV radiation, forming a silicon-rich material layer;

exposing said silicon containing adhesion layer to a silylation and oxygen plasma process, transforming said silicon containing adhesion layer into a silicon-rich silicon oxide;

depositing a second low dielectric constant material layer, which is organic-based or carbon doped $SiO_2$, upon said silicon containing adhesion layer;

providing patterning and etching the second and first low dielectric constant material layers, the silicon containing adhesion layer, and the passivation layer to form trench/via opening extending to the patterned metal wiring;

depositing a blanket layer of barrier metal over the semiconductor substrate and into the trench/via opening;

depositing a blanket conducting copper seed layer over the barrier metal;

depositing by electroplating or electroless plating conducting thick copper upon the copper seed layer;

chemical-mechanical polishing and planarizing to remove excess thick copper, excess copper seed layer and excess barrier metal thereby forming an inlaid interconnect and contact via to said patterned metal wiring with said barrier metal lining the trench/via opening; and depositing and forming a cap layer over the top of the second low dielectric constant material layer, thus passivating the dual damascene.

24. The method of claim 23, wherein said semiconductor substrate is selected from the group consisting of single crystal silicon, silicon-on-insulator (SOI), silicon-germanium (SiGe) with semiconductor devices, interconnect wiring and contact vias over the substrate.

25. The method of claim 23, wherein said layer of first low dielectric constant material layer selected from the group consisting of either organic based materials or carbon doped $SiO_2$ materials, wherein organic based materials are selected from the group consisting of organic polymers comprised of 100% carbon, carbon with one or more of the following elements: hydrogen, fluorine, sulfur, nitrogen, bromine, while carbon doped $SiO_2$ materials are selected from the group consisting of alkyl silsesquioxane, aryl silsesquioxane, CORAL (from Novellus), Black Diamond (from Applied Materials).

26. The method of claim 23, wherein said layer of second low dielectric constant material layer selected from the group consisting of either organic based materials or carbon doped $SiO_2$ materials, wherein organic based materials are selected from the group consisting of organic polymers comprised of 100% carbon, carbon with one or more of the following elements: hydrogen, fluorine, sulfur, nitrogen, bromine, while carbon doped $SiO_2$ materials are selected from the group consisting of alkyl silsesquioxane, aryl silsesquioxane, CORAL (from Novellus), Black Diamond (from Applied Materials).

27. The method of claim 23, wherein said silicon containing adhesion layer is comprised of a silicon containing material selected from the group consisting of TSI resist that is transformed into silicon-rich silicon oxide by subsequent processing steps including silylation, exposure to UV radiation, oxygen plasma treatment and has a low dielectric constant between 3.5 to 5.

28. The method of claim 23, wherein said silicon containing adhesion layer is exposed forming an exposed layer, which is comprised of a silicon-rich material, whereby the UV wavelength ranges from 436 to 100 nm, with an exposure time between 1 sec to 5 min, and furthermore, a pre-silylation bake at between 50 to 400° C. promotes cross-linking of the exposed layer.

29. The method of claim 23, wherein said silicon containing adhesion layer is comprised of TSI resist and is exposed to said silylation, wherein the silylation conditions are as follows: an inert gas, nitrogen, is bubbled in liquid HMDS (hexamethyldisilazane), thus, transporting HMDS in the vapor phase to TSI resist in a reaction chamber, wherein the semiconductor substrate wafer is heated to between 40 to 150° C., or alternately, using solutions of 10% HMDS (hexamethyldisilazane) in xylene causes the resist to become silylated.

30. The method of claim 23, wherein said silicon containing adhesion layer is comprised of TSI resist and is exposed to said oxygen plasma process under conditions as follows: the oxygen plasmas process is performed at temperatures between 40 to 400° C., at pressures between 1 milliTorr to 50 Torr using oxygen gas, oxygen flow rates are from 100 sccm to 50,000 sccm, power settings of between 100 to 2,000 Watts with RF or microwave capacitatively coupled to the plasma, with the addition of forming gas (96% nitrogen, 4% hydrogen) added to the oxygen gas, to aid in the dissociation of oxygen.

31. The method of claim 23, wherein said barrier metal is selected from the group consisting of tantalum, tantalum nitride, titanium nitride, ternary metal silicon nitride; and the barrier metal has a thickness between approximately 50 to 2,000 Angstroms.

32. The method of claim 23, wherein said copper seed layer is deposited over the barrier metal by chemical vapor deposition (CVD) or by sputtering, physical vapor deposition (PVD), in a thickness range from 50 to 2,000 Angstroms.

33. The method of claim 23, wherein said conducting thick copper is in a thickness range from 1 to 10 microns.

34. The method of claim 23, wherein said cap layer is selected from the group consisting of silicon nitride, silicon oxynitride, silicon carbide and is deposited by chemical vapor deposition (CVD), in a thickness range from 50 to 5,000 Angstroms.

* * * * *